United States Patent [19]

Ito et al.

[11] Patent Number: 4,845,143
[45] Date of Patent: Jul. 4, 1989

[54] PATTERN-FORMING MATERIAL

[75] Inventors: Toshio Ito; Miwa Sakata; Yoshio Yamashita; Takateru Asano; Kenji Kobayashi, all of Tokyo, Japan

[73] Assignees: Oki Electric Industry Co., Ltd.; Fuji Chemicals Industrial Co., Ltd., both of Tokyo, Japan

[21] Appl. No.: 234,191

[22] Filed: Aug. 19, 1988

[30] Foreign Application Priority Data

Aug. 21, 1987 [JP] Japan .................................. 62-206368
Dec. 19, 1987 [JP] Japan .................................. 62-322495

[51] Int. Cl.$^4$ ................................................. C08F 8/18
[52] U.S. Cl. ................................... 525/328.8; 525/359.3
[58] Field of Search ........................... 525/328.8, 359.3

[56] References Cited

U.S. PATENT DOCUMENTS 4,090,919 5/1978 Chibata et al. .......................... 524/21
4,720,345 1/1988 Linder et al. .......................... 210/650

OTHER PUBLICATIONS

Iwayanagi et al., IEEE Transactions on Electron Devices, vol. ED-28 (11), Nov. 1981, pp. 1306-1310.

Primary Examiner—Joseph L. Schofer
Assistant Examiner—Bernard Lipman
Attorney, Agent, or Firm—Wenderoth, Lind & Ponack

[57] ABSTRACT

A pattern-forming material is made by halogenoacetylation of the hydroxyl group of the copolymer of hydroxystyrene, and methyl methacrylate or ethyl methacrylate copolymer. The pattern-forming material in this invention is based on a resin copolymer of hydroxystyrene which has excellent dry etching resistance properties and methyl methacrylate or hydroxy ethyl methacrylate which is transparent to deep UV radiation over a relatively wide spectral range, combined with halogenoacetyl groups as photoreactive groups. Further, as the pattern-forming materials of this invention are soluble in the various liquids described below, a resist solution can easily be prepared, and a film of the material can easily be formed by the spin coating process.

10 Claims, 2 Drawing Sheets

F I G. 1
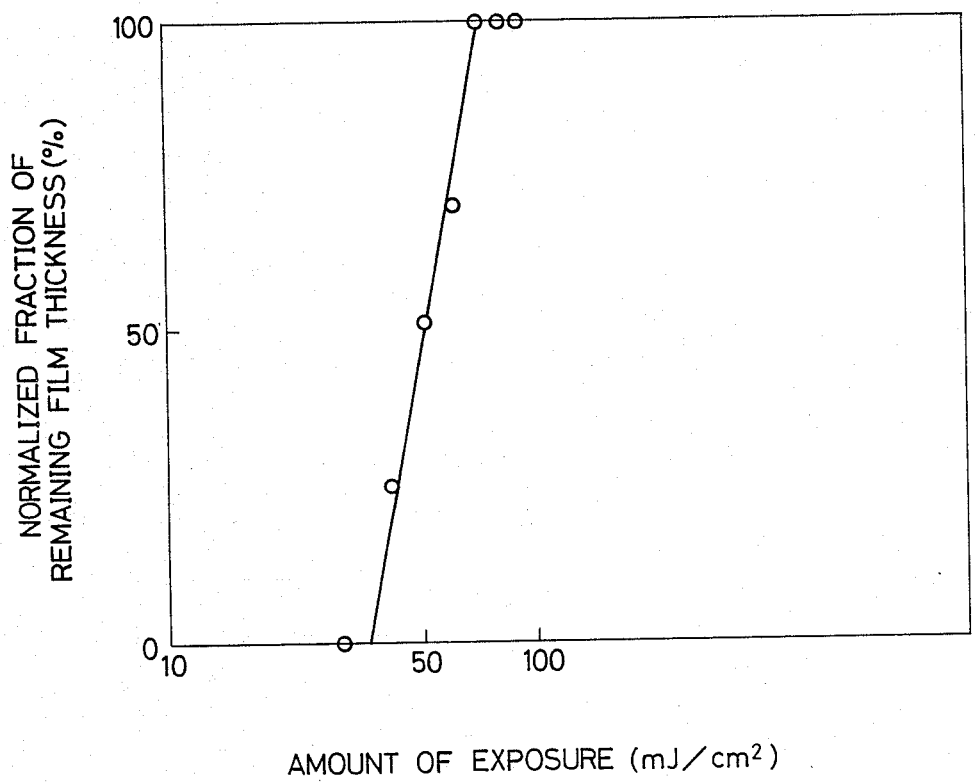

PATTERN-FORMING MATERIAL

BACKGROUND OF THE INVENTION

This invention concerns pattern-forming materials, or resist, used in the manufacture of, for example, semiconductor devices, and in particular a suitable pattern-forming material which can be used as a resist sensitive to deep UV radiation of wavelength 300 nm or less, to electron beams, to x-rays, and the like.

With increasing levels of integration and speed in semiconductor devices such as integrated circuits, demands required for the microfabrication of semiconductors are becoming more and more stringent. Resistant process technology is fundamental to the manufacture of semiconductors, and techniues for obtaining fine patterns or any other desirable patterns are therefore necessary.

Various substances have been used as pattern-forming materials in this process (sometimes referred to hereafter as resists). Owing to their high degree of resolution, positive resists consisting of a Novolac resin base with addition of naphthoquinone diazide photosensitive agents were often employed. With this positive resist and a reduction projection exposure machine using the g line from a super-high pressure Hg lamp (wavelength 436 nm), it is possible to obtain a resist pattern with a line resolution width of about 0.8 $\mu$m.

The resolution in the imaging space is expressed in the equation:

$$R = k\lambda/NA$$

where $\lambda$ is the wavelength of the light used for the exposure, and NA is the numerical aperture of the objective lens. To improve R still further, therefore, it is necessary either to reduce $\lambda$ or to increase NA.

If however NA is increased, there is a problem in that the focal depth becomes shallower. Moreover, to maintain a certain field size, a wide diameter lens has to be used, but it is often difficult to manufacture such a lens. It is thus undesirable to increase NA.

The wavelength of the light source, $\lambda$, on the other hand, can be reduced by using an Xe-Hg lamp or a KrF excimer laser (wavelength 249 nm) which has now come into use as a light source for lithography. It is thus possible to obtain a finer resist pattern by using these light sources and resists that are suited to them.

The following materials are known to be suitable as resists for use with short wavelengths.

For deep UV radiation, there are both positive and negative resists.

An example of a positive resist is MP2400 manufactured by Shipley. This resist absorbs deep UV radiation of wavelength 200–300 nm very well and since it is a positive resist, the part of the resist layer that is to be removed by development has to be fully exposed in order to obtain the pattern. The result is that the upper part of the resist layer to be removed is over-exposed, and the resulting resist pattern after development has a trapezoid shape.

With such a trapezoid resist pattern, as the resist film is thinner towards the fringe of the trapezoid, it is easily removed by etching. For this reason, it is not possible to carry out submicron rule processing of the pattern with the required accuracy.

An example of a negative deep UV resist is the poly (vinylphenol) and bis-azide composition disclosed in IEEE Transactions on Electron Devices, ED-28 (11), November (1981), p. 1306.

As the resist in this reference strongly absorbs deep UV light, the part of the resist rendered insoluble in the developer is limited to the upper part of the layer. The insoluble part is then used as a mask for development, and it is reported that by controlling the developing time, the profile of the remaining resist layer can be changed. Using this resist and contact printer with an Xe-Hg lamp and cold mirror CM-290, it was possible to resolve 0.4 $\mu$m line with 1.6 $\mu$m pitch. As we have stated, the negative resist disclosed in this reference has a strong deep UV absorption of more than 2 $\mu m^{-1}$, and using this property, it is possible to render only the upper part of the layer insoluble in developer after it has been exposed. The pattern dimensions are determined by the insoluble part. The part of the resist which lies directly underneath the exposed area, and which is only slightly exposed, was then developed isotropically to give the resist pattern.

When however it was attempted to form a resist pattern with, for example a line width at sub-micron rule and having an aspect ratio of 2 or more, the part slightly exposed directly beneath the insoluble part dissolved during the development. It was therefore difficult to obtain a resist pattern with a high aspect ratio.

In addition, for an Xe-Hg lamp of high photometric output and light of shorter wavelength in the region of 250 nm, the sensitivity of this negative resist drops and so full advantage could not be taken of short wave light sources.

SUMMARY OF THE INVENTION

The main objective of this invention, therefore, is to resolve the above problems by providing a pattern-forming material with excellent microfabrication properties.

According to this invention, the pattern-forming material is made by $\alpha$-halogenoacetylation of the hydroxyl group of the copolymer of hydroxystyrene, and methyl methacrylate or hydroxy ethyl methacrylate.

The $\alpha$-halogenoacetyl group used in the above $\alpha$-halogenoacetylation may preferably contain one or more of fluorine, chlorine and bromine. The number of $\alpha$-substituent may be 1, 2 or 3.

The pattern-forming material in this invention is based on a resin copolymer of hydroxystyrene which has excellent dry etching resistance properties and methyl methacrylate or hydroxy ethyl methacrylate which is transparent to deep UV radiation over a relatively wide spectral range, combined with halogenoacetyl groups, as photoreactive groups.

Further, as the pattern-forming materials of this invention are soluble in the various liquids described below, a resist solution can easily be prepared, and a film of the material can easily be formed by the spin coating process.

As will be clear from the experimental results described below, the resist formed from the pattern-forming material of this invention has a low overall light absorption (1.6 $\mu m^{-1}$ at 250 nm) so that, although it is a negative resist, the material becomes insoluble not only in the upper part of the layers but right through in the direction of the thickness. This prevents the formation of overhang in the material remaining after developing. Also, as it contains trihalogenoacetyl groups as photoreactive groups, the carbon-halogen bonds are easily ruptured by deep UV radiation (wavelength 200–300 nm) or vacuum UV radiation (wavelength 180 nm or less) so as to generate free radicals. These radicals react with polymer molecules, and insolubility in developer is therefore achieved for practical exposure levels.

BRIEF DESCRIPTION OF THE DRAWINGS

FIG. 1 is a characteristic curve showing the amount of exposure and fraction of film remaining after development of resists prepared from the pattern-forming material of an example of this invention.

DETAILED DESCRIPTION OF THE PREFERRED EMBODIMENTS

Figure 2:
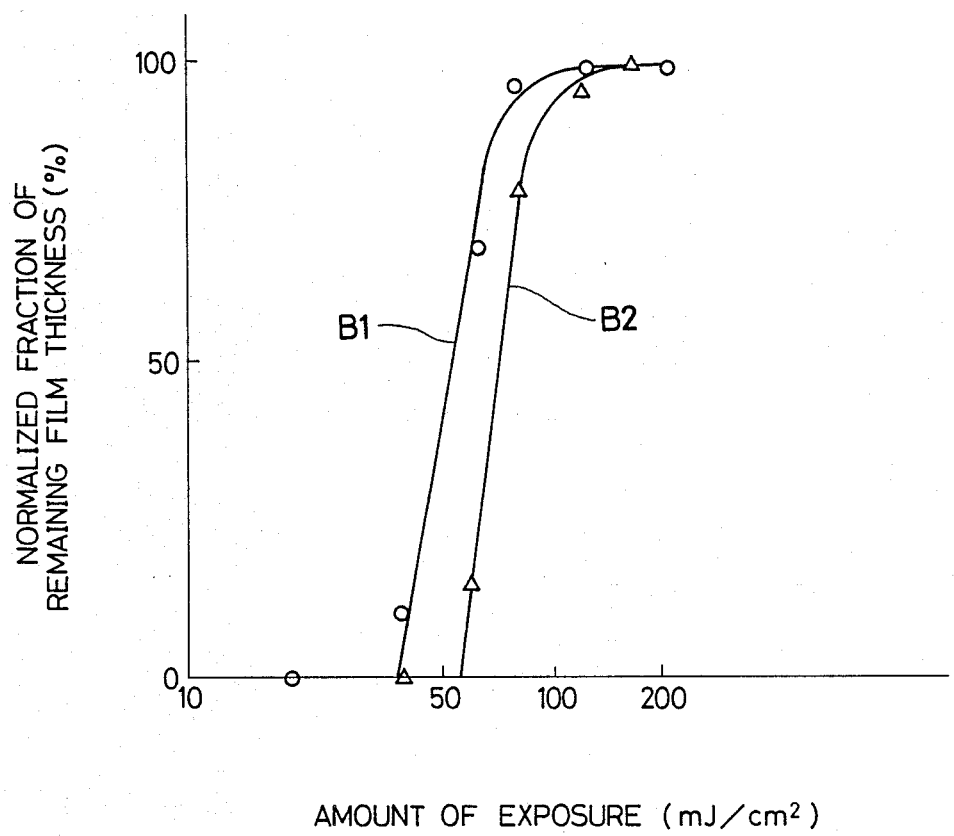
FIG. 2 is a characteristic curve showing the amount of exposure and fraction of film remaining after development, in the case of two developer solutions, of resists prepared from the pattern-forming material of another example of this invention.

We shall now describe some examples of the pattern-forming material of this invention. It should however be understood that the numerical conditions, equipment and reagents mentioned are only given for purposes of illustration, and that the invention is consequently not limited to them.

EXAMPLE 1 (EXAMPLE OF SYNTHESIS OF PATTERN-FORMING MATERIAL)

In a reaction vessel fitted with a sealtight stirrer, 52 g (0.25 mole) of hydroxystyrene-methyl methacrylate copolymer (copolymer ratio 1:1, weight-average molecular weight 9500, relative dispersion 3.6, Maruzen Petroleum Chemical Kabushiki Kaisha), was introduced together with 250 ml of tetrahydrofuran, and a homogeneous solution was made. The atmosphere in the vessel was then replaced with nitrogen, and the vessel was cooled to 0° C.

35 ml (0.25 mole) of triethylamine was added, the mixture was allowed to react for 5 min, and 28 ml (0.25 mole) of trichloroacetyl chloride was added dropwise in over a period of 15 min. The vessel was left at 0° C. for 30 min, its temperature was raised to room temperature and after stirring for 2 hours, the precipitate of triethylamine chloride produced was removed by filtration.

The filtrate was distilled under reduced pressure so as to remove tetrahydrofuran, excess trichloroacetyl chloride and triethylamine. The residue was dissolved in 200 ml of tetrahydrofuran, and the solution was added dropwise into 1 l (1000 ml) of cold methanol so as to form a precipitate. This was separated by filtration, and after repeating the same precipitation procedure once more, the final precipitate was dried under vacuum for 24 hours. In this way, 42 g of the trichloroacetate of hydroxystyrene-methyl methacrylate copolymer (referred to hereafter as the product compound) was obtained.

The NMR spectrum of this product compound confirmed the absence of phenolic hydroxy groups, and showed that its esterification factor was almost 100%. Its IR spectrum showed an absorption at 1780 cm$^{-1}$ characteristic of trichloracetic acid esters.

The product compound was found to be soluble in ketones such as acetone, methyl ethyl ketone and methyl isobutyl ketone; aromatic compounds such as benzene, toluene, xylene, monochlorobenzene and anisole; halogenated alkyl compounds such as trichloroethylene, chloroform and 1,2-dichloroethane; ethers such as tetrahydrofuran and dioxan; and acetic acid esters such as methyl acetate, butyl acetate and methoxy ethyl acetate.

The product compound was dissolved in a suitable solvent, and a dry film of the compound 1 μm thick was formed by spin coating. Light transmittance measurements showed the compound had an absorption coefficient of 1.6 μm$^{-1}$ at a wavelength of 250 nm.

EXAMPLE 2 (EXAMPLE OF EVALUATION OF CHARACTERISTICS OF PATTERN-FORMING MATERIAL)

The pattern-forming material obtained in Example 1 was dissolved in methyl isobutyl ketone, and the solution was filtered through a membrane filter with 0.2 μm perforations so as to prepare a resist solution. The resist solution in this Example contains 25 w/w % of the pattern-forming material.

This resist solution was spin coated onto 3 inch (1 inch is approximately 2.54 cm) silicon substrates so as to form films of 0.8 μm thickness, and the substrates were then prebaked on a hot plate at 80° C. for 1 min. Several substrates were prepared by a similar process.

These substrates were placed successively in intimate contact with chromium masks with various test patterns, and exposed to radiation of wavelength 220–300 nm from an Xe-Hg lamp fitted with a CM250 cold mirror. The exposure time was varied for each substrate.

After exposure, the substrates were immersed in a developer consisting of isoamyl acetate/cyclohexane in the proportion of 3/2 (by volume) for 30 sec, and then rinsed with cyclohexane for 20 sec. The substrates were then postbaked on a hot plate at 80° C. for 1 min.

The film thickness of the resist remaining on each substrate was measured with a film thickness gauge, and the readings were then normalized with respect to the initial film thickness (the thickness just after completion of prebaking) so as to obtain the fraction of film remaining. FIG. 1 is a characteristic curve showing the relation between the amount of exposure and this fraction. The horizontal axis shows exposures (mJ/cm$^2$), while the vertical axis shows normalized fraction of the remaining film thickness (%).

As can be seen from FIG. 1, the normalized fraction of the remaining film thickness of the resist of this invention is 100% at a low exposure of 70 mJ/cm$^2$. Further it is seen that the value γ of the resist contrast, which is an indicator of resolution, is as high as 3.3.

From a silicon substrate which had been exposed at 70 mJ/cm$^2$, a sample was prepared for a scanning electron microscope, and the resist pattern was examined with regard to resolution and profile. As a result, it was found that the sample had a 0.4 μm line and space pattern of almost rectangular shape (with an overhang of about 0.1 μm), and also a pattern consisting of 3 μm width lines separated by 0.4 μm spaces. It was also found that the film thickness of both of the patterns had not changed from the thickness when the samples were coated.

In The above examples, the pattern-forming material is the trichloroacetate of hydroxystyrene/methyl methacrylate copolymer. The invention is however not limited to these examples, and the same effect can also be achieved by replacing chlorine atoms by fluorine or bromine atoms. The same effect is moreover achieved by using a material containing two or more of the elements chlorine, fluorine and bromine.

As is clear from the above description, the pattern-forming material of the above-described example of this invention is based upon a resin copolymer of hydroxystyrene and methyl methacrylate which is transparent to deep UV light over a relatively wide spectral band, and the transparency of the material to deep UV is thereby increased. At the same time, photoreactive groups have been incorporated which have a high sensitivity to light wavelengths in the region of 250 nm.

Using a resist made from this pattern-forming material, the exposed area of the resist layer becomes insoluble right through its thickness. It is therefore possible to obtain a better profile, for example rectangular, than it was in the prior art. Further, as the material also contains photoreactive groups which have a high sensitivity to wavelengths about 250 nm, a resist pattern with a resolution line width of 0.5 μm or less and a high aspect ratio can be obtained without any loss of film thickness even at low exposures of 70 mJ/cm$^2$ if light in this wavelength region is used.

EXAMPLE 3 (EXAMPLE OF SYNTHESIS OF PATTERN-FORMING MATERIAL)

In a reaction vessel fitted with a sealtight stirrer, 12.5 g (0.25 mole) of hydroxystyrene-hydroxy ethyl methacrylate copolymer (copolymer ratio 1:1, weight-average molecular weight 8600, relative dispersion 1.6, Maruzen Petroleum Chemical Kabushiki Kaisha), was introduced together with 200 ml of tetrahydrofuran, and a homogeneous solution was made. The atmosphere in the vessel was then replaced with nitrogen, and the vessel was cooled to 0° C.

28.0 ml of triethylamine was added, the mixture was stirred for 5 min, and 22.5 ml of trichloroacetyl chloride was added dropwise over a period of 15 min. The vessel was left at 0° C. for 30 min, its temperature was raised to room temperature and after stirring for 18 hours, most of the tetrahydrofuran was distilled off under reduced pressure.

To the residue obtained, 500 ml of ethyl acetate was added and after mixing well to form a suspension, the suspension was transferred to a separating funnel containing water. The organic layer was separated, washed twice with 50 ml of a saturated aqueous solution of sodium bicarbonate, washed once with 100 ml of water, washed once with 100 ml of brine, and then dried over anhydrous magnesium sulfate. The product is filtered, and ethyl acetate is distilled off from the filtrate under reduced pressure to give 40 ml of solution.

The solution was added dropwise into 1 l (1000 ml) of methanol cooled to a temperature of 0° C. so as to precipitate the polymer. The precipitate was filtered and after allowing to dry, was dissolved in 40 ml of ethyl acetate. This solution was added dropwise into 1 l (1000 ml) of n-hexane cooled to 0° C. to precipitate the polymer again. The precipitate was then filtered, and dried for 24 hours under vacuum.

In this way, 10.4 g of the trichloroacetate of the copolymer of hydroxystyrene and hydroxy ethyl methacrylate (sometimes referred to hereafter as the product compound) was obtained.

The NMR and IR spectra of this product compound confirmed the absence of phenolic hydroxy groups. Its IR spectrum showed an absorption at 1782 cm$^{-1}$ (wave number) due to the trichloroacetate carbonyl groups, and at 1728 cm$^{-1}$ (wave number) due to the carbonyl groups of the methacrylate unit.

The product compound was found to be soluble in ketones such as acetone, methyl ethyl ketone and methyl isobutyl ketone; aromatic compounds such as benzene, toluene, xylene and monochlorobenzene; halogenated alkyl compounds such as trichloroethylene and chloroform; ethers such as tetrahydrofuran and dioxan; and acetic acid esters such as ethyl acetate, n-butyl acetate, methoxy ethyl acetate and isoamyl acetate.

The product compound was also dissolved in a suitable solvent, one of those described above, and a dry film of the compound 1 μm thick was formed by spon coating. Light transmittance measurements showed the compound had an absorption coefficient of 1.2 μm$^{-1}$ at a wavelength of 250 nm.

EXAMPLE 4 (EXAMPLE OF EVALUATION OF CHARACTERISTICS OF PATTERN-FORMING MATERIAL)

The properties of the pattern-forming material of this invention were evaluated by the method described below.

The pattern-forming material obtained in Example 3 was dissolved in methyl isobutyl ketone, and the solution was filtered through a membrane filter with 0.2 μm perforations so as to prepare a resist solution. The resist solution in this Examnple contains 29 wt % of the pattern-forming material.

This resist solution was spin coated onto 3 inch (1 inch is approximately 2.54 cm) silicon substrates at a rotational speed of 2000 rpm, and the substrates were then prebaked on a hot plate at 100° C. for 1 min. The thickness of the resist film so obtained was 1 μm. Several substrates with such a film were prepared by the same process.

These substrates were placed successively in intimate contact with chromium masks with various test patterns, and exposed to the light from an Xe-Hg lamp fitted with a CM250 cold mirror. The exposure time was varied for each substrate.

After exposure, the substrates were immersed in a developer (Developer B1) consisting of a cyclohexane solution containing 30 v/v % of isoamyl acetate for 35 sec, and then rinsed with cyclohexane for 15 sec. The substrates were then postbaked on a hot plate at 100° C. for 1 min.

The film thickness of the resist remaining on each substrate was measured with a film thickness gauge (fitted with a Taly Step), and the readings were then normalized with respect to the initial film thickness (the thickness just after completion of prebaking) so as to obtain the normalized fraction of film remaining. Curve B1 in FIG. 2 is a characteristic curve showing the relation between the amount of exposure and this normalized fraction using Developer B1. The horizontal axis shows exposures (mJ/cm$^2$), while the vertical axis shows normalized remaining film fractions (%).

Several silicon substrates with resist films were prepared by the above method, and were given different amounts of exposure using the same chromium masks and exposure equipment.

The exposed substrates were immersed in a developer consisting of a cyclohexane solution containing 35 v/v % of isoamyl acetate (Developer B2) for 30 sec, and rinsed with cyclohexane for 15 sec. The substrates were then postbaked on a hot plate as in the case where Developer B1 was used.

The film thickness of the resist remaining on each substrate was measured, and the normalized fraction of film remaining was calculated. Curve B2 in FIG. 2 is a characteristic curve showing the relation between the amount of exposure and this fraction using Developer B2.

As can be seen from FIG. 2, the remaining film thickness of the resist of this invention is 100% at a low exposure of 120 mJ/cm$^2$ for both Developer B1 and B2. Further it is seen that the value $\gamma$ of the resist contrast, which is an indicator of resolution, is as high as 3.9 in the case of Developer B1 and 5.4 in the case of Developer B2.

From a silicon substrate which had been exposed at 160 mJ/cm$^2$, a sample was prepared for a scanning electron microscope, and the resist pattern was examined with regard to resolution and profile. As a result, it was found that the sample had a 0.5 $\mu$m line and space pattern of almost rectangular shape with an overhang (half the difference between the width of the remaining resist on the surface and the part where it is narrowest) of about 0.1 $\mu$m.

In the above examples, the pattern-forming material is the trichloroacetate of hydroxystyrene/hydroxy ethyl methacrylate copolymer. The same effect can however also be achieved by using the monochloroacetate or dichloroacetate of the above copolymer. Further, although the halogen atoms in the examples are chlorine atoms, the same effect can be achieved by replacing chlorine with fluorine or bromine. The same effect is moreover achieved by using a material containing two or more of the elements chlorine, fluorine and bromine.

As is clear from the above description, the pattern-forming material of the above-described example of this invention is bsed upon a resin copolymer of hydroxystyrene and hydroxy ethyl methacrylate which is transparent to deep UV light over a relatively wide spectral range, and the transparency of the material to deep UV is thereby increased. At the same time, photoreactive groups have been incorporated which are highly sensitive to deep UV light.

Using a resist made from this pattern-forming material, the exposed area of the resist layer becomes insoluble right through its thickness. It is therefore possible to obtain a better profile, for example rectangular, than it was in the prior art. Further, even if deep UV light (for example light of wavelength about 250 nm) is used, a resist pattern with a resolution line width of 0.5 $\mu$m or less and a high aspect ratio can be obtained without any loss of film thickness at low exposures of 160 mJ/cm$^2$.

As the photoreactive groups in the pattern-forming material of the various examples of this invention are considered to be easily decomposed by higher energies than deep UV, for example accelerated electron beams or soft X-rays, this material may also be used to make resists for use with electron beams and X-rays.

It is thus possible to provide a pattern-forming material with excellent microfabrication properties.

What is claimed is:

1. A pattern-forming material made by halogenoacetylation of the hydroxyl group of the copolymer of hydroxystyrene, and methyl methacrylate or hydroxy ethyl methacrylate.

2. A pattern-forming material according to claim 1, wherein the halogenoacetylation is mono-, di- or tri-halogenoacetylation.

3. A pattern-forming material according to claim 2, wherein the halogenoacetyl group used in the halogenoacetylation contains one or more of fluorine, chlorine and bromine.

4. A pattern-forming material according to claim 1, wherein the halogenoacetyl group used in the halogenoacetylation contains one or more of fluorine, chlorine and bromine.

5. A pattern-forming material made by trihalogenoacetylation of the hydroxyl group of the copolymer of hydroxystyrene and methyl methacrylate.

6. A pattern-forming material according to claim 5, wherein the trihalogenoacetyl group used in trihalogenoacetylation contains one or more of fluorine, chlorine and bromine.

7. A pattern-forming material obtained by the $\alpha$-halogenoacetylation of the hydroxyl group of the copolymer of hydroxystyrene and hydroxy ethyl methacrylate.

8. A pattern-forming material according to claim 7, wherein the $\alpha$-halogenoacetyl group used in the $\alpha$-halogenoacetylation contains one or more of fluorine, chlorine and bromine.

9. A pattern-forming material according to claim 8, wherein the number of $\alpha$-halogeno substituent is 1, 2 or 3.

10. A pattern-forming material according to claim 7, wherein the number of $\alpha$-halogeno substituent is 1, 2 or 3.

* * * * *